US011542001B1

(12) United States Patent
Parodi et al.

(10) Patent No.: US 11,542,001 B1
(45) Date of Patent: *Jan. 3, 2023

(54) MECHANICAL VIBRATION BASED INTER-MODULE COMMUNICATION IN VEHICLE

(71) Applicant: Amazon Technologies, Inc., Seattle, WA (US)

(72) Inventors: Carlos Guillermo Parodi, Issaquah, WA (US); Scott Michael Wilcox, Kirkland, WA (US)

(73) Assignee: Amazon Technologies, Inc., Seattle, WA (US)

( * ) Notice: Subject to any disclaimer, the term of this patent is extended or adjusted under 35 U.S.C. 154(b) by 281 days.

This patent is subject to a terminal disclaimer.

(21) Appl. No.: 16/941,240

(22) Filed: Jul. 28, 2020

Related U.S. Application Data

(63) Continuation of application No. 15/997,365, filed on Apr. 6, 2018, now Pat. No. 10,759,533.

(51) Int. Cl.
*B64C 39/02* (2006.01)
*B64D 31/06* (2006.01)
*H01L 41/09* (2006.01)
*B64D 31/00* (2006.01)
(Continued)

(52) U.S. Cl.
CPC ............ *B64C 39/024* (2013.01); *B64D 31/06* (2013.01); *H01L 41/09* (2013.01); *H01L 41/1132* (2013.01); *B64C 2201/024* (2013.01); *B64C 2201/042* (2013.01)

(58) Field of Classification Search
CPC ............ B64C 39/024; B64C 2201/024; B64C 2201/042; B64C 39/02; B64D 31/06; B64D 31/00; H01L 41/09; H01L 41/1132; H01L 41/00
See application file for complete search history.

(56) References Cited

U.S. PATENT DOCUMENTS

| 5,929,787 A | 7/1999 | Mee et al. |
| 7,931,239 B2 | 4/2011 | Pedersen et al. |
| 10,648,809 B2 * | 5/2020 | Diem ...................... G01C 17/02 |

(Continued)

OTHER PUBLICATIONS

Office Action for U.S. Appl. No. 15/997,365, dated Feb. 3, 2020, Parodi, "Mechanical Vibration Based Inter-Module Communication in Vehicle", 10 pages.

*Primary Examiner* — Yonel Beaulieu
(74) *Attorney, Agent, or Firm* — Lee & Hayes, P.C.

(57) ABSTRACT

Components of a device may transmit signals between one another using piezo electric transducers (PETs). In a basic system, a first PET may be coupled to and/or in contact with a first location on a member. A second PET may be coupled to and/or in contact with a second location on the member and separated from the first PET by a distance. The first PET may receive a signal (e.g., an electrical voltage) and convert the signal to a mechanical force/stress causing vibration of the member. The vibration may propagate through the member to other locations about the member. The second PET receive the vibration and may convert the vibration back to the signal, such as by converting mechanical force/stress to the electrical voltage (i.e., the signal). A similar process may be performed in reverse to enable the first and second PET to provide two-way communication.

20 Claims, 10 Drawing Sheets

(51) Int. Cl.
*H01L 41/00* (2013.01)
*H01L 41/113* (2006.01)

(56) References Cited

U.S. PATENT DOCUMENTS

| | | |
|---|---|---|
| 10,691,943 B1* | 6/2020 | Ferstl .................... B64C 39/024 |
| 11,358,730 B1* | 6/2022 | Freiheit ................. B64D 31/06 |
| 11,373,543 B1* | 6/2022 | Moeykens ............. G08G 5/025 |
| 2006/0144994 A1 | 7/2006 | Spirov et al. |
| 2008/0223993 A1 | 9/2008 | Spirov et al. |
| 2012/0091284 A1 | 4/2012 | Goodarzi |
| 2017/0199269 A1 | 7/2017 | Allen et al. |
| 2019/0094023 A1* | 3/2019 | Diem ...................... G01C 17/38 |
| 2019/0279387 A1* | 9/2019 | Liu ........................ G06V 20/64 |
| 2020/0218288 A1* | 7/2020 | Johnson ................ G01S 15/93 |
| 2022/0120918 A1* | 4/2022 | Makineni ............... G01S 19/14 |

* cited by examiner

US 11,542,001 B1

MECHANICAL VIBRATION BASED INTER-MODULE COMMUNICATION IN VEHICLE

CROSS-REFERENCE TO RELATED APPLICATIONS

This application is a continuation of, and claims priority to, commonly-owned U.S. patent application Ser. No. 15/997,365, filed on Jun. 4, 2018 and issued as U.S. Pat. No. 10,759,533, which is incorporated herein in its entirety by reference.

BACKGROUND

Unmanned aerial vehicles (UAVs), have become commonly used by hobbyists and some commercial or governmental entities. While many UAVs are used for image capture, many other uses exist. UAVs offer unique advantages and considerations as compared to their counterpart manned aerial vehicles (e.g., typical helicopters and fixed wing aircraft). For example, UAVs may be smaller in overall size and lightweight as compared to their counterpart manned aerial vehicles. However, designing small and lightweight UAVs is challenging.

Redundant systems are important in aircraft. As an example, although some UAVs have up to eight rotors, fewer rotors are often needed to keep the UAV in flight or to enable a controlled landing. While not all systems in a UAV include redundancy, it is desirable to introduce redundancy where possible while weighing cost, weight, and other considerations.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

DETAILED DESCRIPTION

Figure 1:
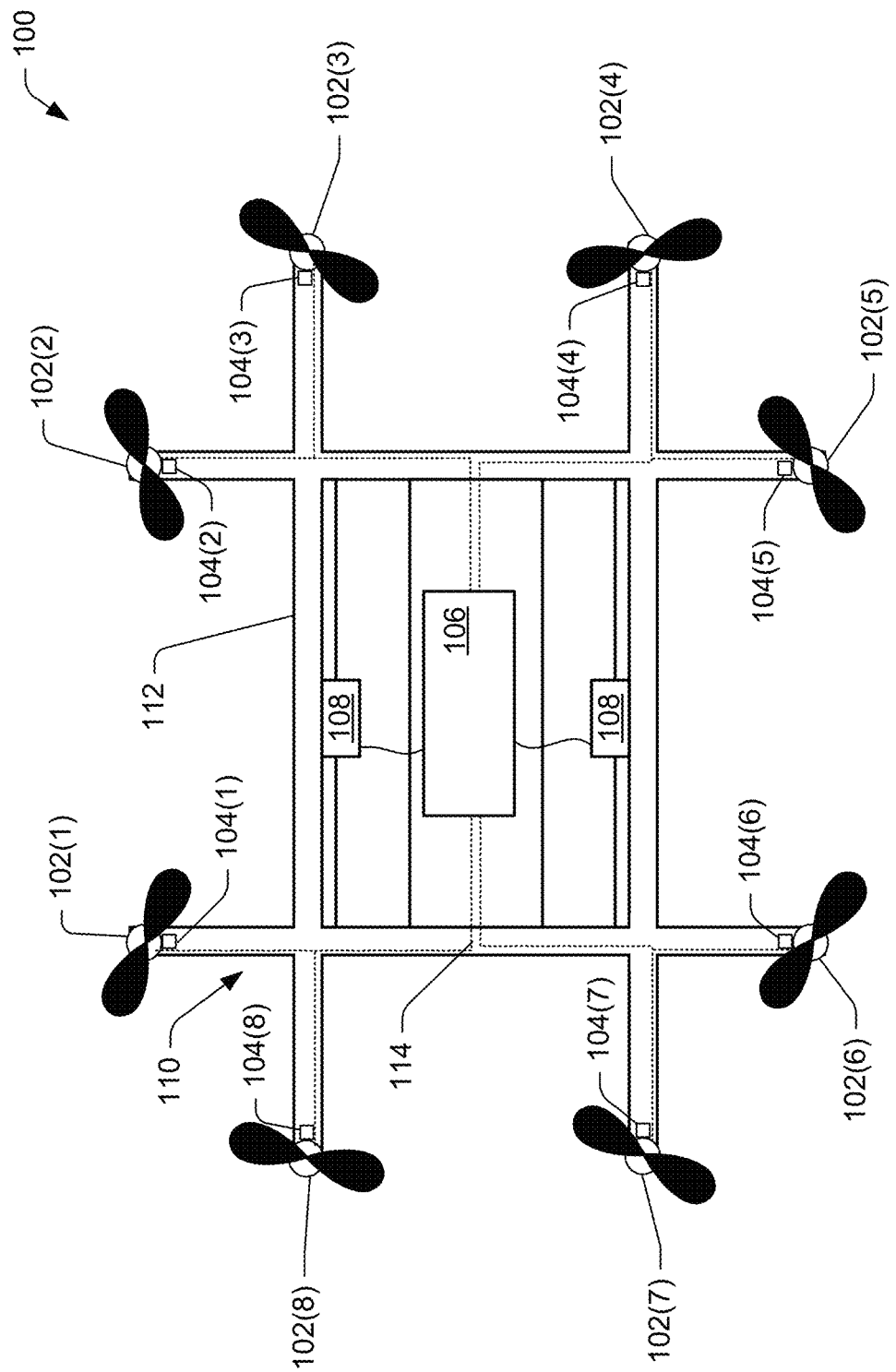
FIG. 1 is a top plan view of an illustrative unmanned aerial vehicle (UAV) including piezo electric communication device(s) configured to enable communications between at least two components by way of vibrations transmitted by a member of the UAV.

This disclosure is directed to sending signals between components using piezo electric transducers (PETs). In a basic system, a first PET may be coupled to and/or in contact with a first location on a member, such as a metal beam, composite beam, or other structure. A second PET may be coupled to and/or in contact with a second location on the member and separated from the first PET by a distance. The first PET may receive a signal (e.g., an electrical voltage) and convert the signal to a mechanical force/stress causing vibration of the member. The vibration may propagate through the member to other locations about the member. The second PET receive the vibration and may convert the vibration back to the signal, such as by converting mechanical force/stress to the electrical voltage (i.e., the signal). A similar process may be performed in reverse to enable the first and second PET to provide two-way communication. Each PET may be in communication with a respective component. The components may generate signals, receive signals, or both.

Some devices, such as unmanned aerial vehicles (UAVs), automobiles, and other mechanical devices may be subject to vibration during normal operation. For example, the motors and rotors of a UAV may cause the frame of the UAV to be subjected to operational vibration at a relatively low frequency (e.g., Hz range). To avoid interference with these operational vibrations, the PETs may generate vibrations having a higher magnitude of frequency, such as a ten-times order of magnitude greater or more than the operational vibrations. As an example, the PETs may generate vibrations in the kHz or MHz frequency range, or possibly greater (e.g., greater than 1 kHz), while the operational vibrations may be measured in a Hz and be less than 1 kHz. In some embodiments, PETs may transmit concurrent vibrations across members of a device using different frequency ranges to avoid interference between the vibrations. Thus a first pair of PETs may communicate using a first frequency range of vibrations transmitted through a member while a second pair of PETs may communicate using a second, different frequency range of vibrations transmitted through the member which do not overlap with the first frequency range of vibrations. This may enable receiving PETs to distinguish which vibrations to process, for example.

In accordance with one or more embodiments, A PET may generate a target resource identification signal via a first sequence of vibrations and a payload signal via a second sequence of vibrations. The target resource identification signal may be read by a particular PET that is associated with a target resource. The particular PET may then pass the payload signal to the target resource. By using the target resource identification signal, vibrations may be sent to particular PETs coupled to a same member or frame, for example.

A UAV may use PETs to transmit signals between various components of the UAV. For example, a controller of the UAV may send signals to an electric speed control (ESC), which controls speed of a motor and rotor. The controller may communicate with multiple ESCs using techniques described herein. The PETs may be used as an alternative to a wired communication system or may be used as a redundant system along with a wired communication system and/or a wireless system using radio frequencies. The PETs may cause vibrations to members of a frame of the UAV and/or to other existing components or structures (e.g., structures, aesthetic parts, etc.), and therefore may be implemented without adding a new member or member dedicated for use by a PET.

The PETs may be powered by a same source as other components or by a different power source. For example, the PETs may include a separate power source, such as a battery and/or capacitor(s) to power the PETs. Capacitors may be used as a backup power supply and may cause relatively little draw of power from a primary power source when the PETs are not is use.

The techniques and systems described herein may be implemented in a number of ways. Example implementations are provided below with reference to the following figures.

FIG. 1 is a top plan view of an illustrative UAV 100 including piezo electric communication device(s) configured to enable communications between at least two components by way of vibrations transmitted across or through a member of the UAV 100. In some embodiments, the UAV 100 may include a component 102(1) in communication with a first PET 104(1). The component 102(1) may be an electronic speed control (ESC) configured with a motor and rotor, which act as a propulsion unit of a plurality of propulsion units of the UAV 100. The UAV 100 may include a controller 106, which may transmit a signal to the component 102(1) and/or other components. The controller 106 may be in communication with a second PET 108 and possibly with multiple second PETs. The UAV 100 may include a frame 110, which may include a member 112 that vibrates in response to mechanical stress/force caused by a PET.

During operation of the UAV 100, the controller 106 may generate a signal for the component 102(1), and possibly for other components 102(2)-(8), for example. The signal may be received by the second PET 108 from the controller 106 and converted from an electrical voltage to a mechanical force/stress to be imparted on the member 110. The second PET 108 and the first PET 104(1), and other PETs 104(2)-(N), may be coupled to or in contact with the member 110 or other members of the frame, or possibly other structure of the UAV. For example, PETs may vibrate wings, struts, portions of a fuselage, and/or other load-bearing or non-load-bearing members of the UAV 100. The vibrations of the member 110 caused by the second PET 108 may be cause mechanical force/stress to be imparted on the first PET 102(1), which may convert this mechanical force/stress back into electrical voltage (or a different predicted voltage), which in turn may be communicated to the first component 102(1) as the signal. In some embodiments, signals may also be transmitted in the reverse direction discussed above. The controller 106 may transmit signals using the PETs to various different components, such as multiple ESCs and/or other devices. In some embodiments, the PETs may transmit signals using a predetermined range of vibrations intended for receipt by specific corresponding PETs. In various embodiments, pairs of PETs may be coupled to members that are isolated from other members, such as by use of intervening parts and/or dampeners.

In some embodiments, the UAV 100 may include a wired communication system 114, which may facilitate sending signals between the controller 106 and other components, such as the components 102(1)-(N). In an event of a failure of the wired communication system, the PETs may be used to transmit signals about the UAV as described above. In various embodiments, the UAV 100 may employ a wireless radio frequency communication system instead of the wired communication system 114, or along with wired communication system 114.

Figure 2:
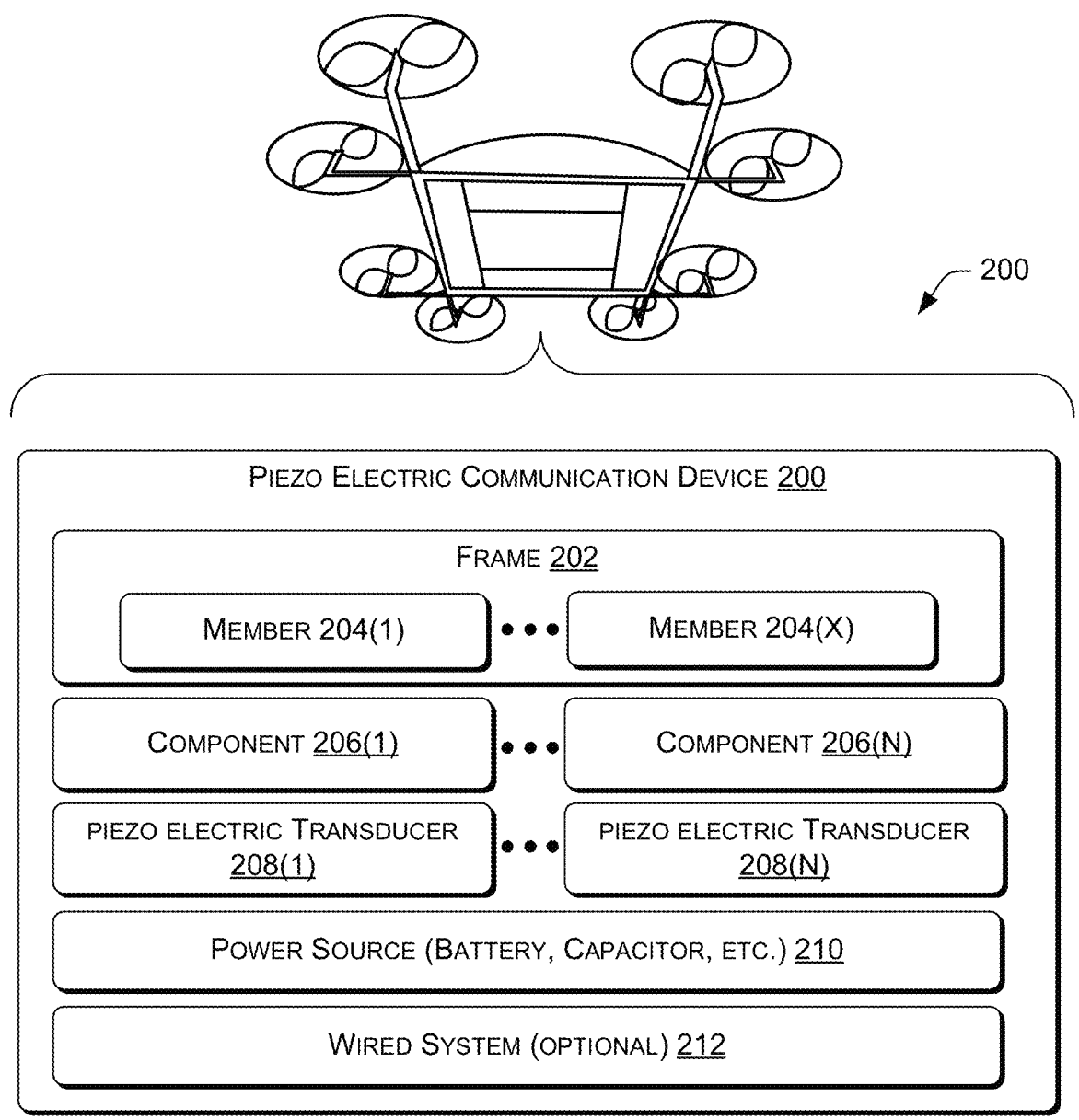
FIG. 2 is a block diagram of an illustrative piezo electric communication device that may be configured with a UAV, other vehicles, and/or other devices.

FIG. 2 is a block diagram of an illustrative piezo electric communication device 200 that may be configured with a UAV (e.g., the UAV 100 shown in FIG. 1), other vehicles, and/or other devices. The piezo electric communication device 200 may include a frame 202 having one or more members 204(1)-(X). The members may be structural and/or non-structural members or parts capable to transmitting or propagating vibrations across a distance of the member. The members may be formed of polymers, composites, metals, and/or other non-dampening materials that sustain at least some vibrations for a predetermined amount of time and across a predetermined distance in response to a mechanical force/stress imparted by a piezo electric transducer. For example, a member may be an aesthetic panel or may be a support beam that supports a component. The frame 202 and members 204(1)-204(X) may be part of an existing device or vehicle, such as a UAV. However, since these members are used to transmit vibrations, the members may be part of the piezo electric communication device 200 described herein.

The piezo electric communication device 200 may include a plurality of components 206(1)-(N). The components 206(1)-(N) may include standard components and/or custom components found on a device or vehicle. When the components 206(1)-(N) are used by a UAV, the components 206(1)-(N) may include a controller, ESCs, a power supply, a navigation system, a sensor, and/or other components shown n FIG. 10.

The piezo electric communication device 200 may include piezo electric transducers 208(1)-(N). In some embodiments, each piezo electric transducer may be paired with a component. For example, the piezo electric transducer 208(1) may be paired with the component 206(1) and may in communication with the component 206(1), such as via a wired connection to receive from the component or output to the component 206(1) an electrical voltage. However, a piezo electric transducer may be configured to communicate with multiple components in some embodiments, and thus act as a shared resource to provide signals for those components to other components by way of vibrations as described herein.

The piezo electric communication device 200 may include a power source 210 to provide power to the piezo electric transducers 208(1)-(N). The power source 210 may be a shared power source that also powers the device or vehicle, including the components 206(1)-(N). In some embodiments, the power source 210 may be a dedicated power source used to power the piezo electric transducers 208(1)-(N). The power source 210 may be implemented as a battery or as one or more capacitors. The capacitor(s) may store energy from a different power source, and generate little draw of power when the piezo electric transducers 208(1)-(N) are not used. The capacitor(s) may be used as a backup power source, such as when the piezo electric transducers 208(1)-(N) are used as a redundant system.

In accordance with one or more embodiments, the piezo electric communication device 200 may include a wired system 212, which may be used as a primary communication system between at least some of the components 206(1)-(N). In the event of a failure of the wired system, or in response to other predetermined situations, the piezo electric transducers 208(1)-(N) may be used to exchange at least some signals between components as discussed herein.

Figure 3:
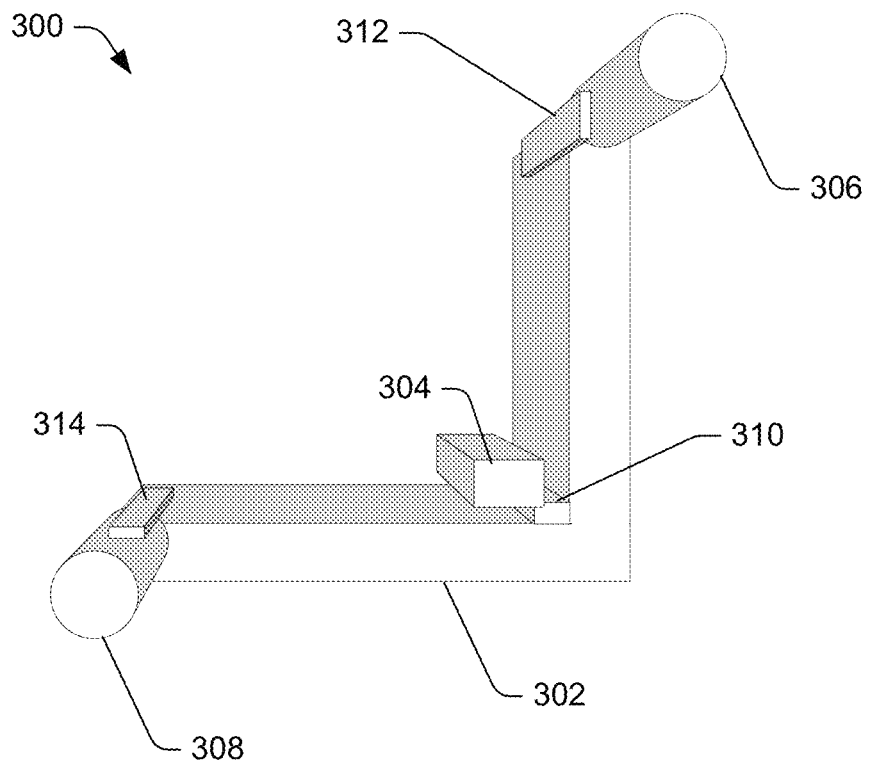
FIG. 3 is a perspective view of an illustrative piezo electric communication device configured with non-isolated members.

FIG. 3 is a perspective view of an illustrative piezo electric communication device 300 configured with non-isolated members. The piezo electric communication device 300 includes a member 302. The member 302 may be a single part, such as a molded part formed as a single piece. In some embodiments, the member may be formed of multiple parts that are connected together using a coupling, such as a fastener, a wield, a press-fit, or other coupling that enables vibrations to pass between the parts without substantially changing a frequency of vibrations of the member 302. Thus, the parts (if more than one) of the member 202 may be non-isolated from one another, where isolation disrupts a vibration passing between parts. The piezo electric communication device 300 may include a first component 304, a second component 306, and a third component 308. The first component 304 may transmit signals to the second component 306 and/or to the third component 308, such as by generating an electrical voltage. To communicate the signals (i.e., the electrical voltage(s)), each component may be in communication with a PET. A first PET 310 may be in communication with the first component 304. A second PET 312 may be in communication with the second component 306. A third PET 314 may be in communication with the third component 308. In an example operation, the first component 304 may generate a signal for the second component 306. The signal (i.e., an electrical voltage) may be communicated from the first component 304 to the first PET 310. The first PET 310 may convert the signal into a mechanical force/stress, which is imparted on the member 302 as a vibration. The vibration may travel across the member 302 and be received by the second PET 312. The second PET 312 may convert the vibration (i.e., the mechanical force/stress) to the signal (i.e., the electrical voltage). The second PET 312 may communicate the signal to the second component 306. Meanwhile the third PET 314 may also receive the vibration from the first PET. In some embodiments, the vibration may include a frequency range designated for receipt or implementation by the second PET 312 and not the third PET 314. As an example, the second PET 312 may include kHz frequencies while the third PET 314 may receive MHz frequency ranges. Thus, the third PET 314 may ignore the frequencies outside of certain ranges. In various embodiments, the vibrations may include a target resource identification signal via a first sequence of vibrations and a payload signal via a second sequence of vibrations. The target resource identification signal may be read by second PET 312, which may determine that the second component is the target resource. The second PET 312 may then provide the payload signal to the second component 306. Meanwhile, the third PET may determine that the third component 308 is not the target resource, and may refrain from processing the payload signal, for example.

Figure 4:
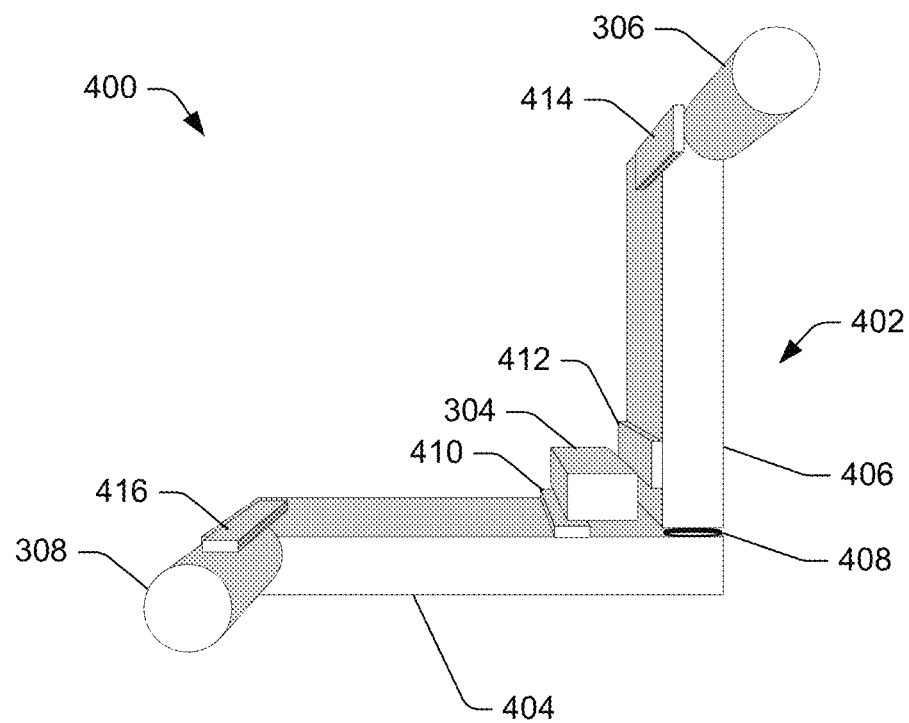
FIG. 4 is a perspective view of an illustrative piezo electric communication device configured with isolated members.

FIG. 4 is a perspective view of an illustrative piezo electric communication device 400 configured with isolated members. The piezo electric communication device 400 includes a frame 402. The frame 402 may include a first member 404 and a second member 406, and possibly additional members. The first member 404 may be isolated from the second member 406 by a gap or by a dampener 408, such as a rubber gasket that absorbs vibrations. The isolation disrupts a vibration passing between the first member 404 and the second member 406. Thus, each member may act like a different communication conduit, and may carry vibrations within a same frequency range to respective components without concern for which component may receive the signal.

The piezo electric communication device 300 may include the first component 304, the second component 306, and the third component 308. The first component 304 may transmit signals to the second component 306 and/or to the third component 308, such as by generating an electrical voltage. To communicate the signals (i.e., the electrical voltage(s)), each component may be in communication with a PET.

A first PET 410 and a second PET 412 may be in communication with the first component 304. A third PET 414 may be in communication with the second component 306. A fourth PET 416 may be in communication with the third component 308. In an example operation, the first component 304 may generate a signal for the second component 306. The signal (i.e., an electrical voltage) may be communicated from the first component 304 to the second PET 412. The second PET 412 may convert the signal into a mechanical force/stress, which is imparted on the second member 406 as a vibration. The vibration may travel across the second member 406 and be received by the third PET 414. The third PET 414 may convert the vibration (i.e., the mechanical force/stress) to the signal (i.e., the electrical voltage). The third PET 414 may communicate the signal to the second component 306. Meanwhile the fourth PET 416 may not receive the vibration due to the gap or dampener 408 between the first member 404 and the second member 406.

In another example operation, the first component 304 may generate a signal for the third component 308. The signal (i.e., an electrical voltage) may be communicated from the first component 304 to the first PET 410. The first PET 410 may convert the signal into a mechanical force/stress, which is imparted on the first member 404 as a vibration. The vibration may travel across the first member 404 and be received by the fourth PET 416. The fourth PET 416 may convert the vibration (i.e., the mechanical force/stress) to the signal (i.e., the electrical voltage). The fourth PET 416 may communicate the signal to the third component 308. Meanwhile the third PET 414 may not receive the vibration due to the gap or dampener 408 between the first member 404 and the second member 406.

FIGS. 5-9 are flow diagrams of illustrative processes to perform communications of a signal using piezo electric transducers. The processes are illustrated as a collection of blocks in a logical flow graph, which represent a sequence of operations that can be implemented in hardware, software, or a combination thereof. The order in which the operations are described is not intended to be construed as a limitation, and any number of the described blocks can be combined in any order and/or in parallel to implement the process.

Figure 5:
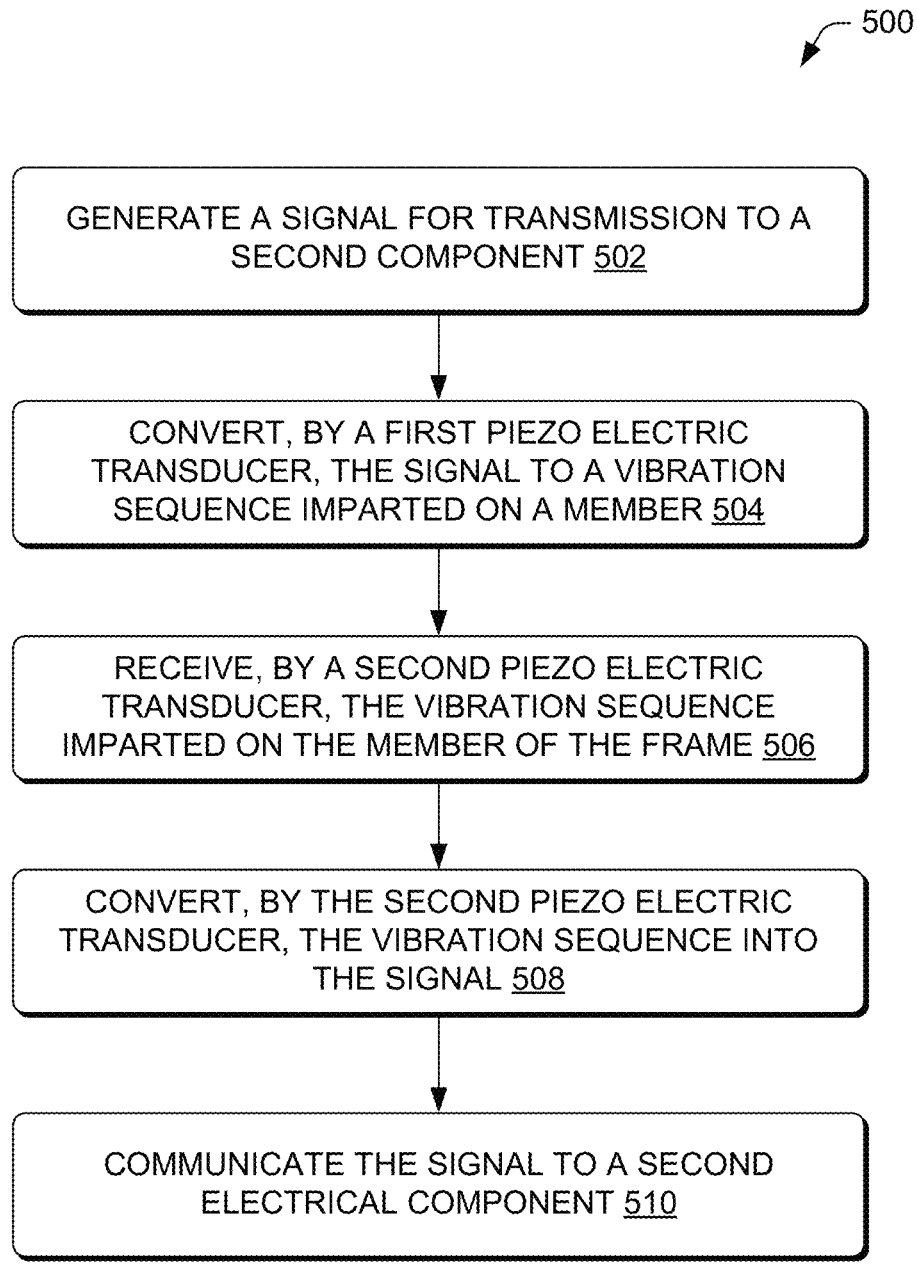
FIG. 5 is a flow diagram of an illustrative process to transmit a signal between different components using associated piezo electric transducers.

FIG. 5 is a flow diagram of an illustrative process 500 to transmit a signal between different components using associated piezo electric transducers. The process 500 is described with reference to the piezo electric communication device 200 and may be performed by the piezo electric communication device 200 and/or other preceding disclosure. Of course, the process 500 may be performed in other similar and/or different environments and/or by other similar and/or different devices including vehicles (e.g., a UAV, etc.).

At 502, a first component may generate a signal for transmission to a second component. The signal may be an electrical voltage or a series of electrical voltages.

At 504, a first piezo electric transducer may receive the signal and convert the signal to a vibration sequence imparted on a member. For example, the first piezo electric transducer may convert an electrical voltage (i.e., the signal) to a mechanical force/stress imparted on a member, which causes the member to vibrate with a predetermined frequency.

At 506, a second piezo electric transducer may be subjected to the vibration, and thus the mechanical force/stress conveyed by the vibrations from the operation 504. The second piezo electric transducer may be coupled to or in contact with the member at a different location than the first piezo electric transducer, which is also coupled to or in contact with the member. The term "coupled" as used herein includes a PET situated proximate to the member and configured to impart mechanical force/stress on the member or receive mechanical force/stress from the member, but possibly not being secured to the member.

At 508, the second piezo electric transducer may convert the vibration sequence, which is received a mechanical force/stress, into an electrical voltage, which is used as a signal for the second electrical component. The second piezo electric transducer may be a same or similar device as the first piezo electric transducer.

At 510, the second piezo electric transducer may communicate the signal (i.e., electrical voltage) to the second electrical component. Thus, the second electrical component may receive the signal from the first component by way of vibrations through the member.

Figure 6:
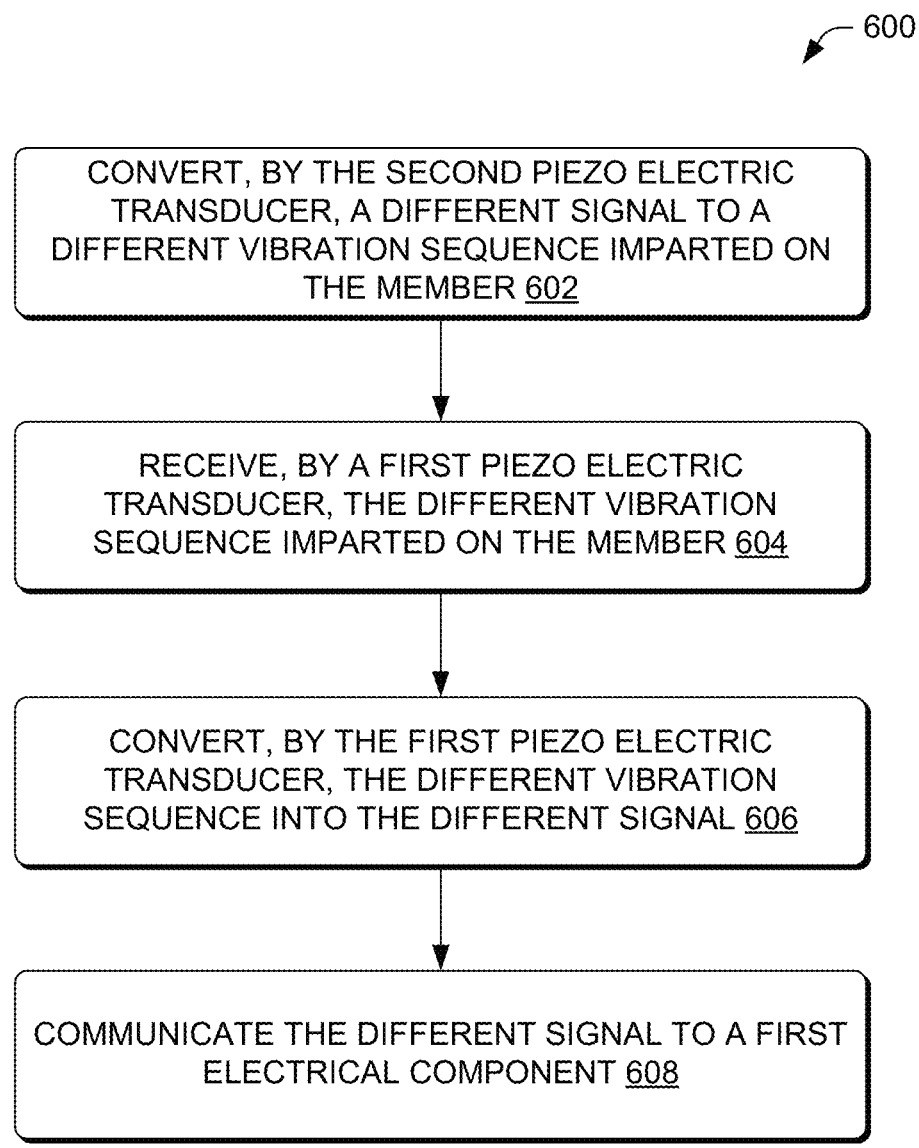
FIG. 6 is a flow diagram of an illustrative process to transmit a return signal between the different components using the associated piezo electric transducers.

FIG. 6 is a flow diagram of an illustrative process 600 to transmit a return signal between the different components using the associated piezo electric transducers. The process 600 is described with reference to the piezo electric communication device 200 and may be performed by the piezo electric communication device 200 and/or other preceding disclosure. Of course, the process 600 may be performed in other similar and/or different environments and/or by other similar and/or different devices including vehicles (e.g., a UAV, etc.). In some embodiments, the process 600 may continue from the process 500 described above with reference to FIG. 5, such as continuing from the operation 510, for example.

At 602, the second piezo electric transducer may convert a different signal to a different vibration sequence imparted on the member. For example, the second piezo electric transducer may convert a different electrical voltage to a different mechanical force/stress imparted on the member to cause the member to vibrate.

At 604, the first piezo electric transducer may receive the different vibration sequence imparted on the member. For example, the first piezo electric transducer may be subjected to mechanical force/stress from the vibrations of the member.

At 606, the first piezo electric transducer may convert the different vibration sequence into the different signal. For example, the first piezo electric transducer may convert the different mechanical force/stress to a different electrical voltage, which may be used as a signal for the first electrical component.

At 608, the first piezo electric transducer may communicate the different signal to a first electrical component. For example, the first piezo electric transducer may communicate the electrical voltage to the first electrical component.

Figure 7:
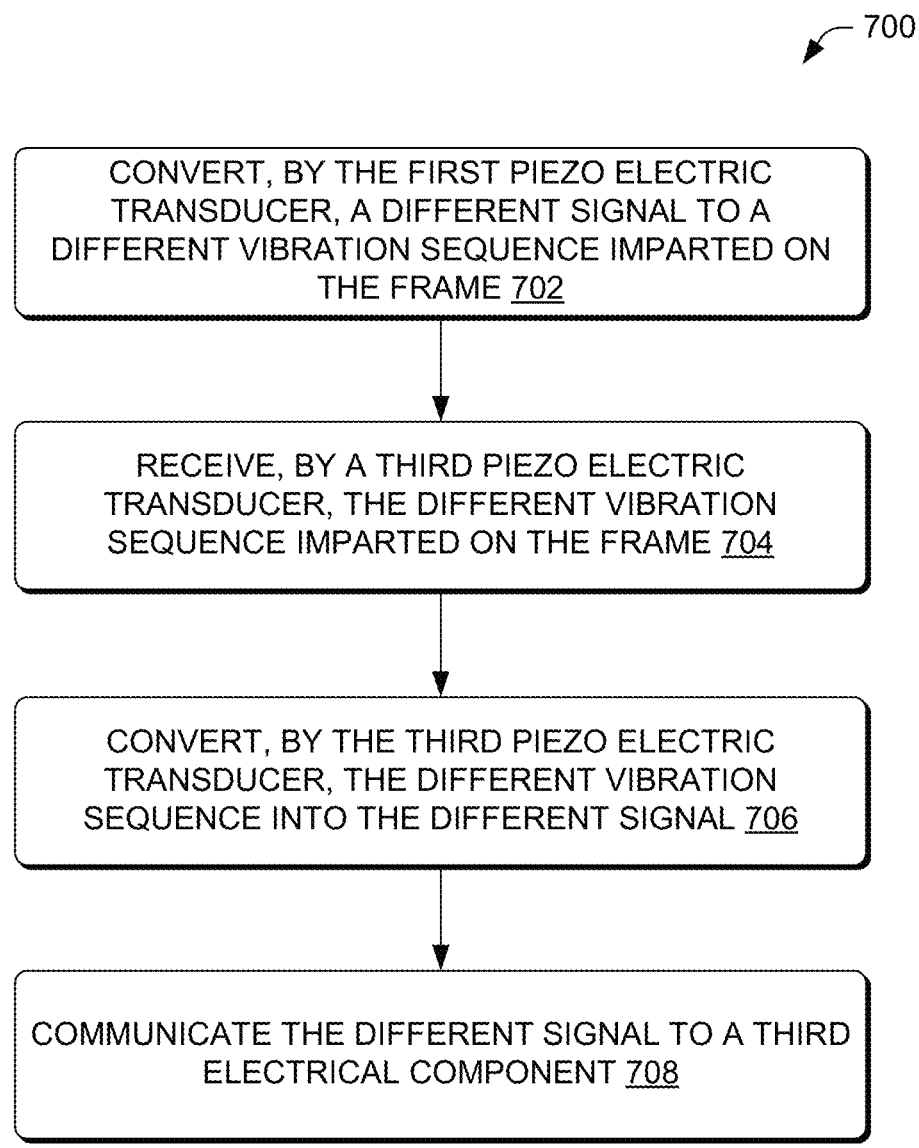
FIG. 7 is a flow diagram of an illustrative process to transmit a signal to a third component using associated piezo electric transducers.

FIG. 7 is a flow diagram of an illustrative process 700 to transmit a signal to a third component using associated piezo electric transducers. The process 700 is described with reference to the piezo electric communication device 200 and may be performed by the piezo electric communication device 200 and/or other preceding disclosure. Of course, the process 700 may be performed in other similar and/or different environments and/or by other similar and/or different devices including vehicles (e.g., a UAV, etc.). In some embodiments, the process 700 may continue from the process 500 described above with reference to FIG. 5 or the process 600 described above with reference to FIG. 6, such as continuing from the operation 510 or 608, respectively, for example.

At 702, the first piezo electric transducer may receive a different signal from the first component. The first piezo electric transducer may convert the different signal to a different vibration sequence imparted on the frame. For example, the first piezo electric transducer may convert a different electrical voltage to a different mechanical force/stress imparted on the frame or member.

At 704, a third piezo electric transducer may receive the different vibration sequence imparted on the frame. For example, the third piezo electric transducer may be subjected to mechanical force/stress due to the vibrations that propagate through the member. The first piezo electric transducer may be separated from the third piezo electric transducer by at least a portion of the member of the frame.

At 706, the third piezo electric transducer may convert the different vibration sequence into the different signal. For example, the third piezo electric transducer may convert the different mechanical force/stress into the different electrical voltage as the different signal.

At 708, the third piezo electric transducer may communicate the different signal to a third electrical component. For example, the third piezo electric transducer may communicate the different electrical voltage to the third electrical component.

In some embodiments, the vibrations generated for the third piezo electric transducer may be within a first frequency range that is different than a frequency range of vibrations intended for the second piezo electric transducer. For example, the vibrations generated for the third piezo electric transducer may be within a kHz frequency range while the vibrations intended for the second piezo electric transducer may be with a MHz frequency range, or vice versa.

In various embodiments, the signal intended for the third electrical component may include a target resource identification signal, which may be used to identify which component is to process a payload signal. This process is described next.

Figure 8:
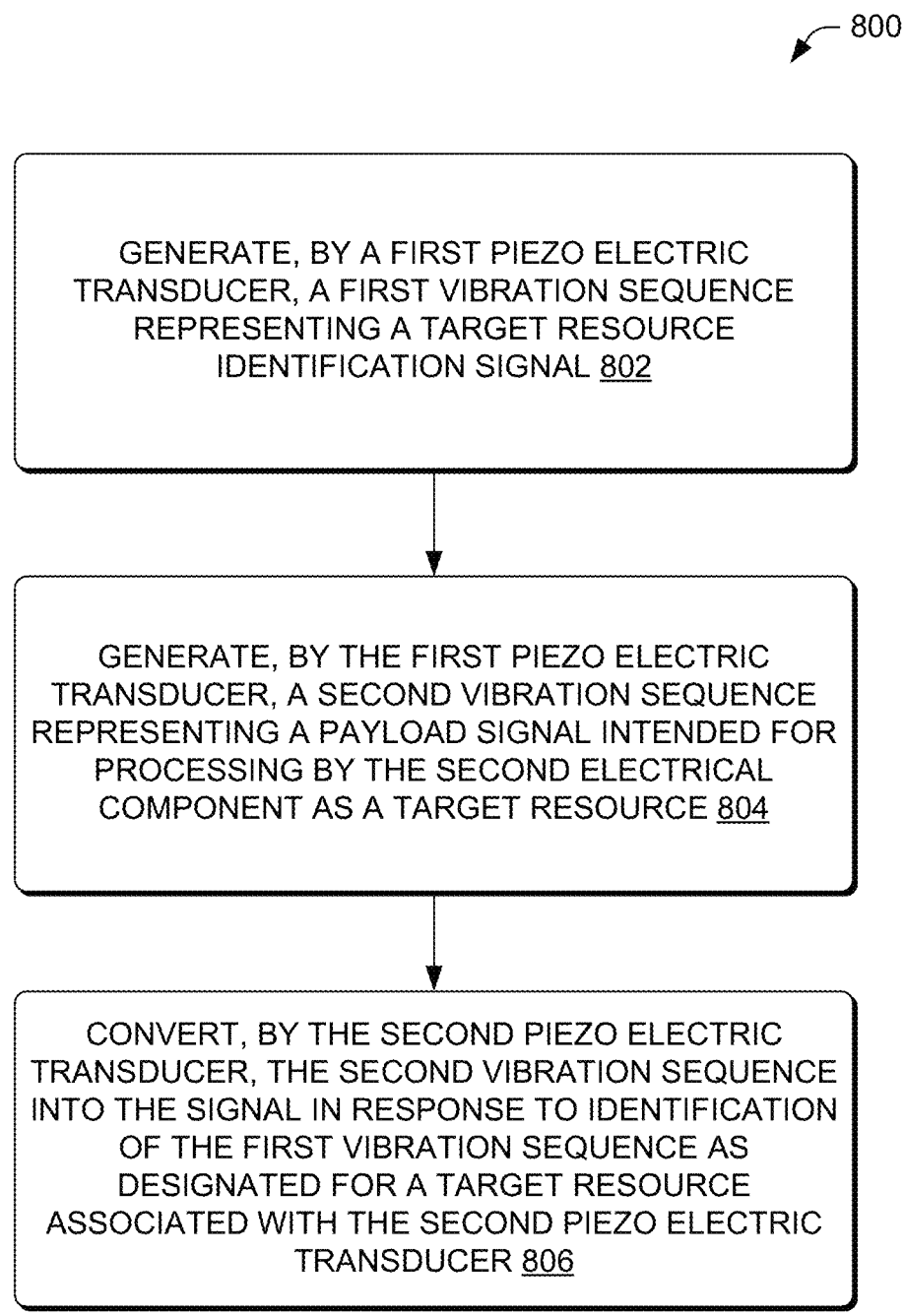
FIG. 8 is a flow diagram of an illustrative process to transmit a target resource identification signal and a payload signal for the target resource using associated piezo electric transducers.

FIG. 8 is a flow diagram of an illustrative process 800 to transmit a target resource identification signal and a payload signal for the target resource using associated piezo electric transducers. The process 800 is described with reference to the piezo electric communication device 200 and may be performed by the piezo electric communication device 200 and/or other preceding disclosure. Of course, the process 800 may be performed in other similar and/or different environments and/or by other similar and/or different devices including vehicles (e.g., a UAV, etc.). The process 800 may be performed with the process 700 described with reference to FIG. 7.

At 802, the first piezo electric transducer may generate a first vibration sequence representing a target resource identification signal. The target resource identification signal may indicate an intended component to receive the signal (e.g., the second electrical component, the second electrical component, etc. The first piezo electric transducer may create the target resource identification signal or may receive the target resource identification signal from a respective component, such as the first electrical component.

At 804, the first piezo electric transducer may generate a second vibration sequence representing a payload signal intended for processing by the second electrical component as a target resource. The payload signal may include a signal to be processed by the target resource, such as the second electrical component. Other components or other piezo electric transducers that receive the signal that are not the target resource may disregard the payload signal.

At 806, the second piezo electric transducer may receive the second vibration sequence and convert the second vibration sequence into the signal in response to identification of the first vibration sequence as designated for a target resource associated with the second piezo electric transducer. In some embodiments, the payload signal may be received by other components, but not processed by components that are not the target resource, such as by executing instructions on those components to refrain from processing signals intended or designated for other components.

Figure 9:
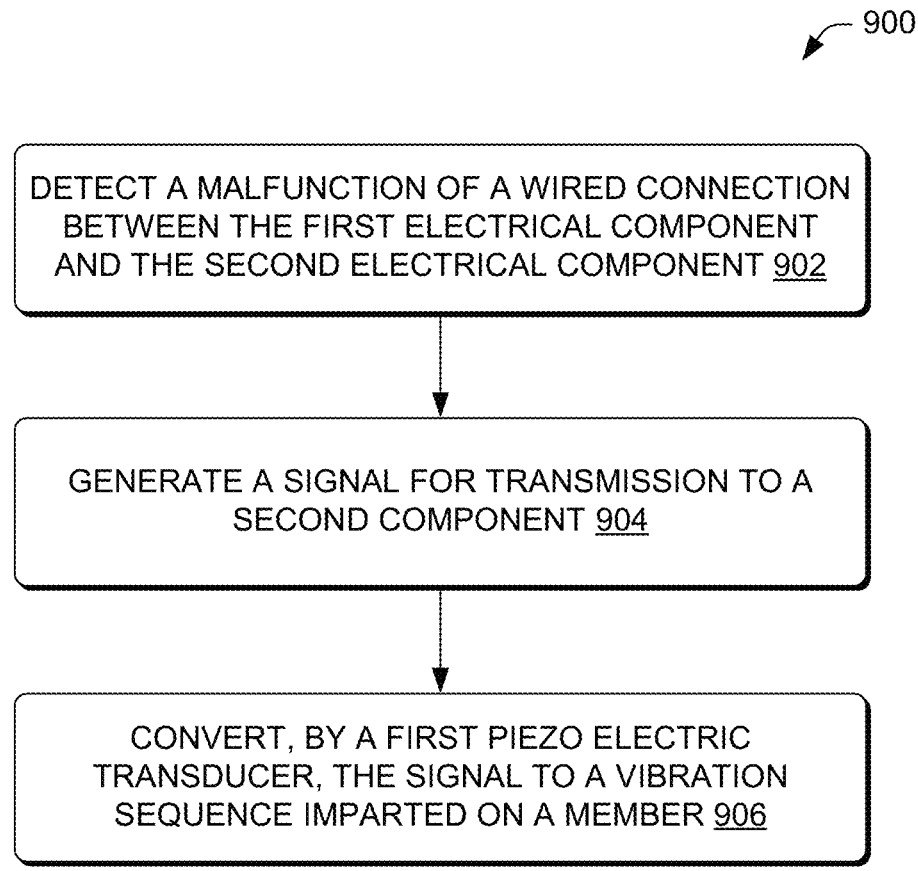
FIG. 9 is a flow diagram of an illustrative process to utilize piezo electric transducers as a redundant communication process.

FIG. 9 is a flow diagram of an illustrative process 900 to utilize piezo electric transducers as a redundant communication process. The process 900 is described with reference to the piezo electric communication device 200 and may be performed by the piezo electric communication device 200 and/or other preceding disclosure. Of course, the process 900 may be performed in other similar and/or different environments and/or by other similar and/or different devices including vehicles (e.g., a UAV, etc.). The process 900 may be performed with any of the processes 500, 600, 700, and/or 800 described above with respect to FIGS. 5-8, respectively.

At 902, a malfunction of a wired connection between the first electrical component and the second electrical component may be detected. For example, a component may not receive a signal transmitted via the wired connection, may time-out, or may otherwise fail to receive a signal. This failure may cause use of processes described above which use piezo electric transducers to communicate signals across at least portions of members of a device to other components of the device.

At 904, a first component may generate a signal for transmission to a second component. The first component may generate the same signal as intended for communication via the wired system, or the signal may be a different signal for communication by a piezo electric transducer.

At 906, the first piezo electric transducer may convert the signal to a vibration sequence imparted on a member of a frame of the device. The operation 906 may be the same as the operation 504 described with reference to FIG. 5 and/or the same as the operation 602 described with reference to FIG. 6, for example.

Figure 10:
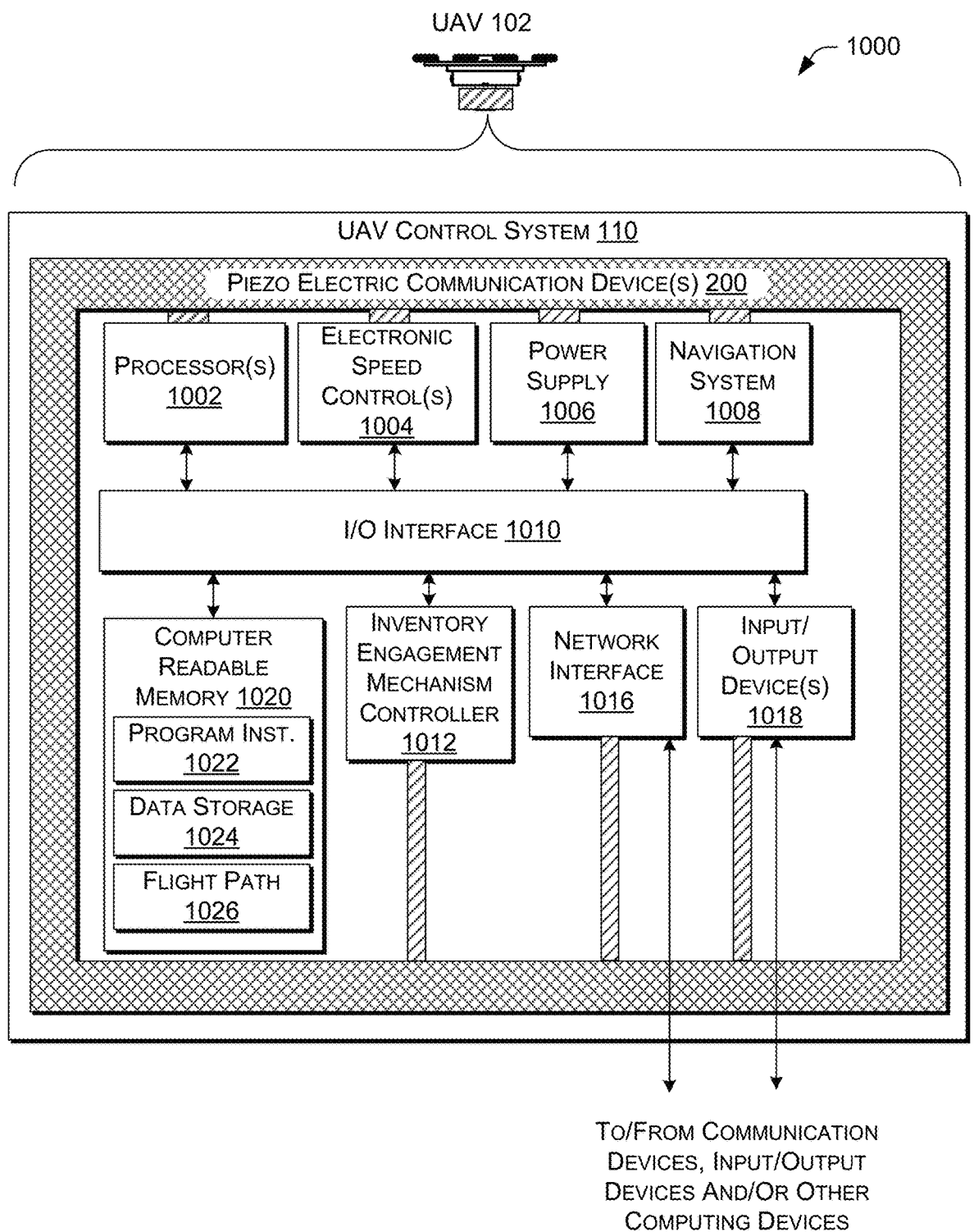
FIG. 10 is a block diagram of an illustrative computing architecture of the UAV.

FIG. 10 is a block diagram of an illustrative computing architecture of the UAV. In various examples, the block diagram may be illustrative of one or more aspects of the UAV control system 110 that may be used to implement the various systems, devices, and techniques discussed above. In the illustrated implementation, the UAV control system 110 includes one or more processors 1002, coupled to a non-transitory computer readable storage medium 1020 via an input/output (I/O) interface 1010. The UAV control system 110 may also include one or more electronic speed control (ESC) 1004, power supply module 1006 and/or a navigation system 1008. The UAV control system 110 further includes an inventory engagement mechanism controller 1012, one or more piezo electric communication device(s) 200, a network interface 1016, and one or more input/output devices 1018.

In various implementations, the UAV control system 110 may be a uniprocessor system including one processor 1002, or a multiprocessor system including several processors 1002 (e.g., two, four, eight, or another suitable number). The processor(s) 1002 may be any suitable processor capable of executing instructions. For example, in various implementations, the processor(s) 1002 may be general-purpose or embedded processors implementing any of a variety of instruction set architectures (ISAs), such as the x86, PowerPC, SPARC, or MIPS ISAs, or any other suitable ISA. In multiprocessor systems, each processor(s) 1002 may commonly, but not necessarily, implement the same ISA.

The non-transitory computer readable storage medium 1020 may be configured to store executable instructions, data, flight paths and/or data items accessible by the processor(s) 1002. In various implementations, the non-transitory computer readable storage medium 1020 may be implemented using any suitable memory technology, such as static random access memory (SRAM), synchronous dynamic RAM (SDRAM), nonvolatile/Flash-type memory, or any other type of memory. In the illustrated implementation, program instructions and data implementing desired functions, such as those described above, are shown stored within the non-transitory computer readable storage medium 1020 as program instructions 1022, data storage 1024 and flight path data 1026, respectively. In other implementations, program instructions, data and/or flight paths may be received, sent or stored upon different types of computer-accessible media, such as non-transitory media, or on similar media separate from the non-transitory computer readable storage medium 1020 or the UAV control system 110. Generally speaking, a non-transitory, computer readable storage medium may include storage media or memory media such as flash memory (e.g., solid state memory), magnetic or optical media (e.g., disk) coupled to the UAV control system 110 via the I/O interface 1010. Program instructions and data stored via a non-transitory computer readable medium may be transmitted by transmission media or signals such as electrical, electromagnetic, or digital signals, which may be conveyed via a communication medium such as a network and/or a wireless link, such as may be implemented via the network interface 1016.

In one implementation, the I/O interface 1010 may be configured to coordinate I/O traffic between the processor(s) 1002, the non-transitory computer readable storage medium 1020, and any peripheral devices, the network interface or other peripheral interfaces, such as input/output devices 1018. In some implementations, the I/O interface 1010 may perform any necessary protocol, timing or other data transformations to convert data signals from one component (e.g., non-transitory computer readable storage medium 1020) into a format suitable for use by another component (e.g., processor(s) 1002). In some implementations, the I/O interface 1010 may include support for devices attached through various types of peripheral buses, such as a variant of the Peripheral Component Interconnect (PCI) bus standard or the Universal Serial Bus (USB) standard, for example. In some implementations, the function of the I/O interface 1010 may be split into two or more separate components, such as a north bridge and a south bridge, for example. Also, in some implementations, some or all of the functionality of the I/O interface 1010, such as an interface to the non-transitory computer readable storage medium 1020, may be incorporated directly into the processor(s) 1002.

The ESC(s) 1004 communicate with the navigation system 1008 (also referred to as a "controller" herein) and adjust the power of each respective propeller motor to guide the UAV along a determined flight path. The power supply module 1006 may control the charging and any switching functions associated with one or more power modules (e.g., batteries) of the UAV.

The navigation system 1008 may include a global positioning system (GPS) or other similar system that can be used to navigate the UAV to and/or from a location. The inventory engagement mechanism controller 1012 communicates with the actuator(s) or motor(s) (e.g., a servo motor) used to engage and/or disengage inventory. For example, when the UAV is positioned over a level surface at a delivery location, the inventory engagement mechanism controller 1012 may provide an instruction to a motor that controls the inventory engagement mechanism to release the inventory.

The one or more piezo electric communication device(s) 200 may communicate with components described with reference to FIG. 10, such as the navigation system 1008, the ESC 1004, the inventory engagement mechanism controller 1012, and so forth. Each piezo electric transducer of the one or more piezo electric communication device(s) 200 may be in communication via a wired connection or other conduit to respective components. In some embodiments, the one or more piezo electric communication device(s) 200 may be a redundant communication system for the I/O interface 1010.

The network interface 1016 may be configured to allow data to be exchanged among the UAV control system 110, other devices attached to a network, such as other computer systems, and/or with UAV control systems of other UAVs. For example, the network interface 1016 may enable wireless communication between numerous UAVs. In various implementations, the network interface 1016 may support communication via wireless general data networks, such as a Wi-Fi network. For example, the network interface 1016 may support communication via telecommunications networks such as cellular communication networks, satellite networks, and the like.

Input/output devices 1018 may, in some implementations, include one or more displays, image capture devices, thermal sensors, infrared sensors, time of flight sensors, accelerometers, pressure sensors, weather sensors, airflow sensors, etc. Multiple input/output devices 1018 may be present and controlled by the UAV control system 110. One or more of these sensors may be utilized to assist in landings as well as avoiding obstacles during flight.

As shown in FIG. 10, the memory may include program instructions 1022 which may be configured to implement the example processes and/or sub-processes described above. The data storage 1024 may include various data stores for maintaining data items that may be provided for determining flight paths, retrieving inventory, landing, identifying a level surface for disengaging inventory, etc.

In various implementations, the parameter values and other data illustrated herein as being included in one or more data stores may be combined with other information not described or may be partitioned differently into more, fewer, or different data structures. In some implementations, data stores may be physically located in one memory or may be distributed among two or more memories.

Those skilled in the art will appreciate that the UAV control system 110 is merely illustrative and is not intended to limit the scope of the present disclosure. In particular, the computing system and devices may include any combination of hardware or software that can perform the indicated functions, including computers, network devices, internet appliances, PDAs, wireless phones, pagers, etc. The UAV control system 110 may also be connected to other devices that are not illustrated, or instead may operate as a standalone system. In addition, the functionality provided by the illustrated components may in some implementations be combined in fewer components or distributed in additional components. Similarly, in some implementations, the functionality of some of the illustrated components may not be provided and/or other additional functionality may be available.

Those skilled in the art will also appreciate that, while various items are illustrated as being stored in memory or storage while being used, these items or portions of them may be transferred between memory and other storage devices for purposes of memory management and data integrity. Alternatively, in other implementations, some or all of the software components may execute in memory on another device and communicate with the illustrated UAV control system 110. Some or all of the system components or data structures may also be stored (e.g., as instructions or structured data) on a non-transitory, computer-accessible medium or a portable article to be read by an appropriate drive, various examples of which are described above. In some implementations, instructions stored on a computer-accessible medium separate from the UAV control system 110 may be transmitted to the UAV control system 110 via transmission media or signals such as electrical, electromagnetic, or digital signals, conveyed via a communication medium such as a wireless link. Various implementations may further include receiving, sending or storing instructions and/or data implemented in accordance with the foregoing description upon a computer-accessible medium. Accordingly, the techniques described herein may be practiced with other UAV control system configurations.

Conclusion

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. A device comprising:
  a frame;
  an electrical component coupled to the frame; and
  a piezo electric transducer in communication with the electrical component, the piezo electric transducer configured to receive generated vibrations and to convert the generated vibrations into one or more signals for the electrical component.

2. The device as recited in claim 1, wherein:
  the frame includes a member; and
  the piezo electric transducer is in contact with the member and is configured to receive the generated vibrations via the member.

3. The device as recited in claim 1, wherein the piezo electric transducer is in contact with a member of the frame and further comprising:
  a second electrical component coupled to the frame; and
  a second piezo electric transducer that is in contact with the member and that is in communication with the second electrical component.

4. The device as recited in claim 1, further comprising:
  one or more propulsion units coupled to the frame; and
  an electronic speed control (ESC) coupled to a member of the frame, the ESC in communication with the piezo electric transducer and configured to provide speed control for at least one propulsion unit of the one or more propulsion units based at least in part on one or more control signals.

5. The device as recited in claim 4, further comprising:
a controller coupled to the frame, the controller in communication with the piezo electric transducer, the controller to provide the one or more control signals to the at least one propulsion unit to control the device; and
a wired connection between the controller and the ESC, the wired connection serving as a primary conduit for transmitting one or more signals between the controller and the ESC, and the piezo electric transducer serving as a redundant conduit for transmitting the one or more signals between the controller and the ESC.

6. A method comprising:
generating a signal for transmission to an electrical component;
converting, by a piezo electric transducer, the signal to a vibration sequence imparted on a frame;
receiving the vibration sequence imparted on the frame;
converting the vibration sequence into the signal; and
communicating the signal to the electrical component.

7. The method as recited in claim 6, wherein:
the signal is generated by the electrical component and is for transmission to a second electrical component;
the signal is converted to the vibration sequence by the piezo electric transducer;
the vibration sequence is received by a second piezo electric transducer that is separated from the second piezo electric transducer by at least a portion of a member of the frame; and
the vibration sequence is converted into the signal by the second piezo electric transducer.

8. The method as recited in claim 6, further comprising, prior to the converting of the signal by the piezo electric transducer, detecting a malfunction of a wired connection between the electrical component and a second electrical component.

9. The method as recited in claim 6, wherein the converting the signal to the vibration sequence includes:
generating a first vibration sequence representing a target resource identification signal; and
generating a second vibration sequence representing a payload signal intended for processing by a second electrical component as a target resource,
wherein the second electrical component converts the second vibration sequence into the signal in response to identification of the first vibration sequence as designated for a second electrical component as the target resource.

10. The method as recited in claim 6, further comprising:
converting, by a second piezo electric transducer, a different signal to a different vibration sequence imparted on a member of the frame;
receiving, by the piezo electric transducer, the different vibration sequence imparted on the member;
converting, by the piezo electric transducer, the different vibration sequence into the different signal; and
communicating the different signal to the electrical component.

11. A method comprising:
generating, by a first piezo electric transducer, a first vibration sequence representing a target resource identification signal;
generating, by the first piezo electric transducer, a second vibration sequence representing a payload signal intended for processing as a target source;
receiving, by a second piezo electric transducer that is different than the first piezo electric transducer, the second vibration sequence; and
converting, by the second piezo electric transducer and in response to identification of the first vibration sequence as being associated with the target source, the second vibration sequence into the target resource identification signal.

12. The method as recited in claim 11, wherein the target resource identification signal indicates an intended component to receive the target resource identification signal and further comprising generating, by the first piezo electric transducer, the target resource identification signal.

13. The method as recited in claim 11, wherein the target resource identification signal indicates an intended component to receive the target resource identification signal and further comprising receiving the target resource identification signal from a different component.

14. The method as recited in claim 11, further comprising:
receiving an indication that the payload signal has been received by one or more other components; and
determining that the payload signal was not processed by the one or more other components.

15. The method as recited in claim 14, further comprising, prior to determining that the payload signal was not processed by the one or more other components, executing one or more instructions on the one or more other components to cause the one or more other components to refrain from processing the payload signal.

16. A method comprising:
detecting a malfunction of a wired connection between a first electrical component and a second electrical component;
generating, based at least in part on the malfunction, a signal; and
converting, by a piezo electric transducer, the signal into a vibration sequence imparted on a member of a frame of a device.

17. The method as recited in claim 16, wherein detecting the malfunction comprises determining that the second electrical component did not receive one or more signals transmitted by the first electrical component via the wired connection.

18. The method as recited in claim 16, wherein detecting the malfunction comprises determining a time-out associated with transmission of one or more signals from the first electrical component to the second electrical component.

19. The method as recited in claim 16, wherein the first electrical component generates the signal for transmission to the second electrical component via the wired connection.

20. The method as recited in claim 16, further comprising:
receiving the vibration sequence imparted on the frame;
converting the vibration sequence into the signal; and
communicating the signal to the second electrical component.

* * * * *